(12) United States Patent
Iwasawa et al.

(10) Patent No.: US 8,193,056 B2
(45) Date of Patent: Jun. 5, 2012

(54) METHOD OF MANUFACTURING SEMICONDUCTOR DEVICE

(75) Inventors: Kazuaki Iwasawa, Kanagawa-ken (JP);
Shogo Matsuo, Oita-ken (JP);
Kenichiro Toratani, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 99 days.

(21) Appl. No.: 12/878,320

(22) Filed: Sep. 9, 2010

(65) Prior Publication Data
US 2011/0065271 A1    Mar. 17, 2011

(30) Foreign Application Priority Data

Sep. 11, 2009  (JP) ................... P2009-210549
Mar. 30, 2010  (JP) ................... P2010-079846

(51) Int. Cl.
*H01L 21/8247* (2006.01)

(52) U.S. Cl. ........ 438/257; 438/201; 438/211; 438/594; 257/E21.179

(58) Field of Classification Search ............. 438/201, 438/211, 257, 264, 593, 594; 257/E21.179
See application file for complete search history.

(56) References Cited

U.S. PATENT DOCUMENTS

2004/0007765 A1    1/2004  Hiyama et al.
2007/0287254 A1*  12/2007  Natori et al. ............ 438/264

FOREIGN PATENT DOCUMENTS

JP         2004-47565         2/2004

* cited by examiner

*Primary Examiner* — Thanhha Pham
(74) *Attorney, Agent, or Firm* — Finnegan, Henderson, Farabow, Garrett & Dunner, L.L.P.

(57) ABSTRACT

According to one embodiment, a method of fabricating a semiconductor device is disclosed. The method includes the steps of: forming a tunnel insulating film on a semiconductor substrate; forming a floating gate electrode on the tunnel insulating film; and forming a silicon nitride film including a low-density silicon nitride film and a high-density silicon nitride film on the floating gate electrode. The method also includes the steps of: forming an isolation trench thereby to expose the low-density silicon nitride film exposed at least in a portion of a side surface of the isolation trench; forming an isolating insulating film covering an internal surface of the isolation trench; removing the silicon nitride film; and forming an interelectrode insulating film and a control gate electrode both covering the floating gate electrode and the isolating insulating film.

14 Claims, 14 Drawing Sheets

METHOD OF MANUFACTURING SEMICONDUCTOR DEVICE

CROSS-REFERENCE TO RELATED APPLICATIONS

This application is based upon and claims the benefit of priority from the prior Japanese Patent Application No. 2009-210549, filed on Sep. 11, 2009 and 2010-079846, filed on Mar. 3, 2010; the entire contents of which are incorporated herein by reference.

FIELD

Embodiments of the invention relate generally to a method of manufacturing a semiconductor device.

BACKGROUND

As the development of more highly integrated LSIs progresses, the miniaturization of LSIs, especially, the miniaturization of device-isolation regions, becomes more and more necessary to enhance the operation speed of the device, to achieve power saving of the device, and to reduce the manufacturing cost of the device. A technique known as the shallow trench isolation (STI) technique, in which isolation trenches are filled with insulation films, is widely employed to form device-isolation regions. However, the miniaturization of LSIs makes it more difficult to fill the isolation trenches with insulation films without forming any gap in between, and, as a result, causes a problem that so-called voids and seams are formed. The existence of such voids and seams brings about a problem that the STI structure collapses to have an improper shape during the later processes.

DETAILED DESCRIPTION

Figure 1:
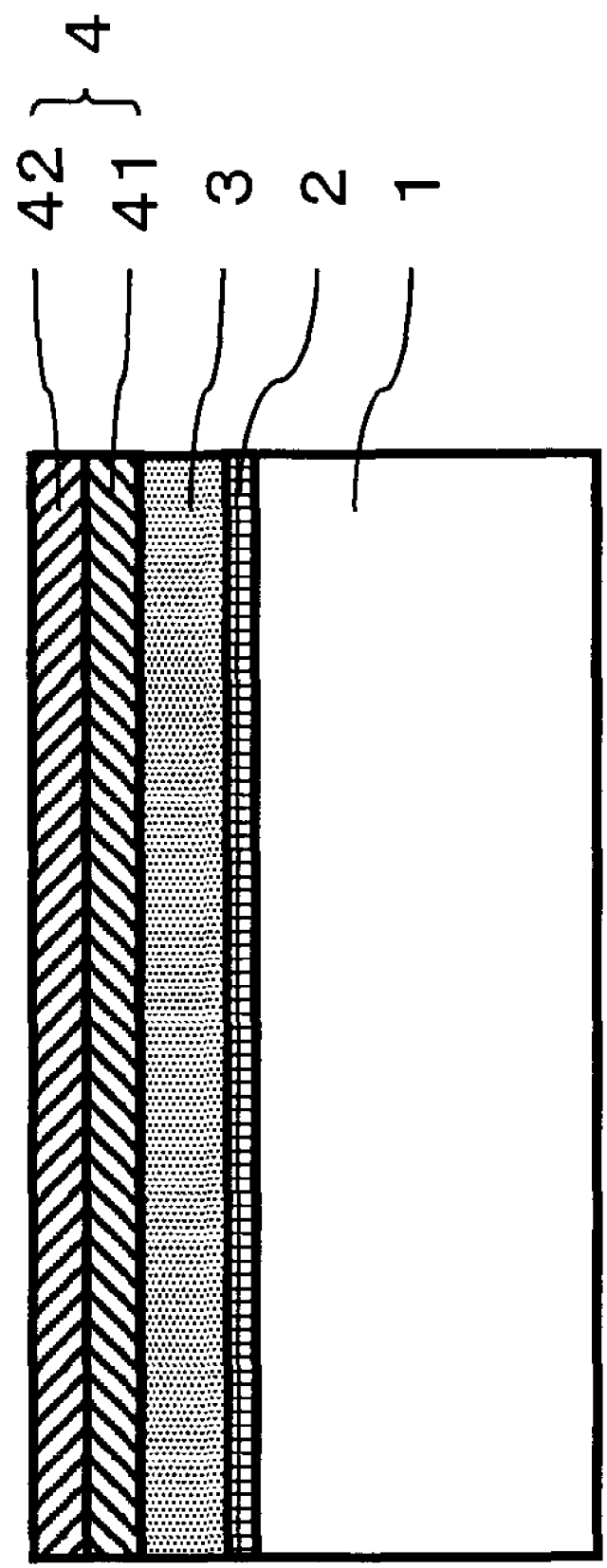
FIG. 1 is a schematic sectional diagram illustrating a method of manufacturing a semiconductor device according to a first embodiment of the invention.

An embodiment of the invention provides a method of manufacturing a semiconductor device that includes a semiconductor substrate, a tunnel insulating film, a floating gate electrode, a silicon nitride film, an isolating insulating film, an interelectrode insulating film, and a control gate electrode. The method includes a step of forming the tunnel insulating film on the semiconductor substrate, a step of forming the floating gate electrode on the tunnel insulating film, and a step of forming the silicon nitride film including a low-density silicon nitride film and a high-density silicon nitride film on the floating gate electrode. The method also includes a step of forming an isolation trench by processing the silicon nitride film, the floating gate electrode, the tunnel insulating film, and the semiconductor substrate, and thereby exposing the low-density silicon nitride film at least in a portion of a side surface of the isolation trench, a step of forming the isolating insulating film which covers an internal surface of the isolation trench, a step of flattening the isolating insulating film, a step of etching the isolating insulating film and thereby lowering a top surface of the isolating insulating film, a step of removing the silicon nitride film, and a step of forming the interelectrode insulating film and the control gate electrode which cover both the floating gate electrode and the isolating insulating film.

Some embodiments of the invention will be described below by referring to the drawings.

Each drawing is nothing but a schematic or a conceptual one. Such measurements in the drawings as the relationship between the thickness and the width of each portion, and the relative sizes of various portions to one another, are not necessarily identical to their respective counterparts in the actual device. In addition, even if two or more drawings illustrate the same portion, the dimensions and the relative sizes in one drawing may differ from their respective counterparts in another drawing.

In addition, if an element that has appeared in a drawing and has been described in detail in an earlier section of the specification reappears later in another drawing, the element is denoted by the same reference numeral that has been given earlier and the element is not described in detail again.

(First Embodiment)
A method of manufacturing a semiconductor device according to a first embodiment will be described by referring to FIGS. 1 to 8.

As FIG. 1 shows, a SiON film which has a thickness of 8 nm and which is to be tunnel insulating films 2 is formed on a semiconductor substrate 1 doped with a desired impurity. Then, a P-doped polycrystalline silicon film which has a thickness of 80 nm and which is to be floating gate electrodes 3 is formed, and, after that, a silicon nitride film which is to be silicon nitride films 4 is formed.

Each silicon nitride film 4 mentioned above has a laminate structure including a low-density silicon nitride film 41 and a high-density silicon nitride film 42 formed on the low-density silicon nitride film 41. The thickness of the silicon nitride film 4 ranges from 30 nm to 70 nm. The thickness of the low-density silicon nitride film 41 is approximately the same as that of the high-density silicon nitride film 42, but the low-density silicon nitride film 41 may be thicker than the high-density silicon nitride film 42.

The low-density silicon nitride film 41 is deposited at a temperature of 420° C. in a mixed-gas atmosphere of HCD ($Si_2Cl_6$, Hexa Chloro Disilane) and $NH_3$, whereas the high-density silicon nitride film 42 is deposited at a temperature of 780° C. in a mixed-gas atmosphere of DCS ($SiCl_2H_2$, Dichlorosilane) and $NH_3$.

Figure 2:
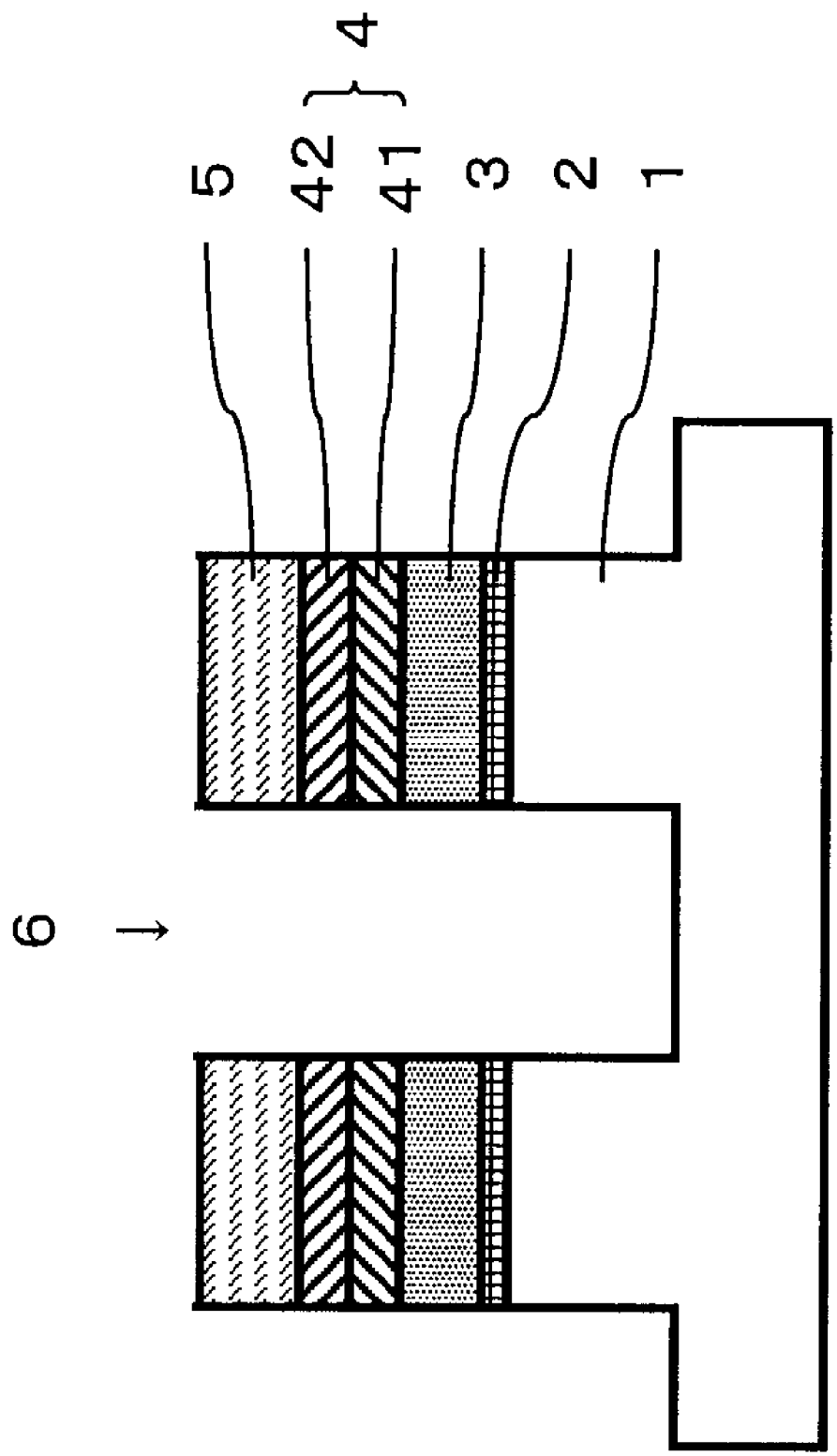
FIG. 2 is a schematic sectional diagram illustrating the method of manufacturing a semiconductor device according to the first embodiment of the invention.

Then, a silicon oxide film 5 is formed on the silicon nitride film 4. Then, with a resist film (not illustrated) used as a mask, the silicon oxide film 5, the silicon nitride film 4, the floating gate electrode 3, the tunnel insulating film 2, and the semiconductor substrate 1 are processed in this order by the RIE method. In this way, isolation trenches 6 are formed as shown in FIG. 2. Both the low-density silicon nitride film 41 and the high-density silicon nitride film 42 are exposed in the sidewalls of each isolation trench 6.

Figure 3:
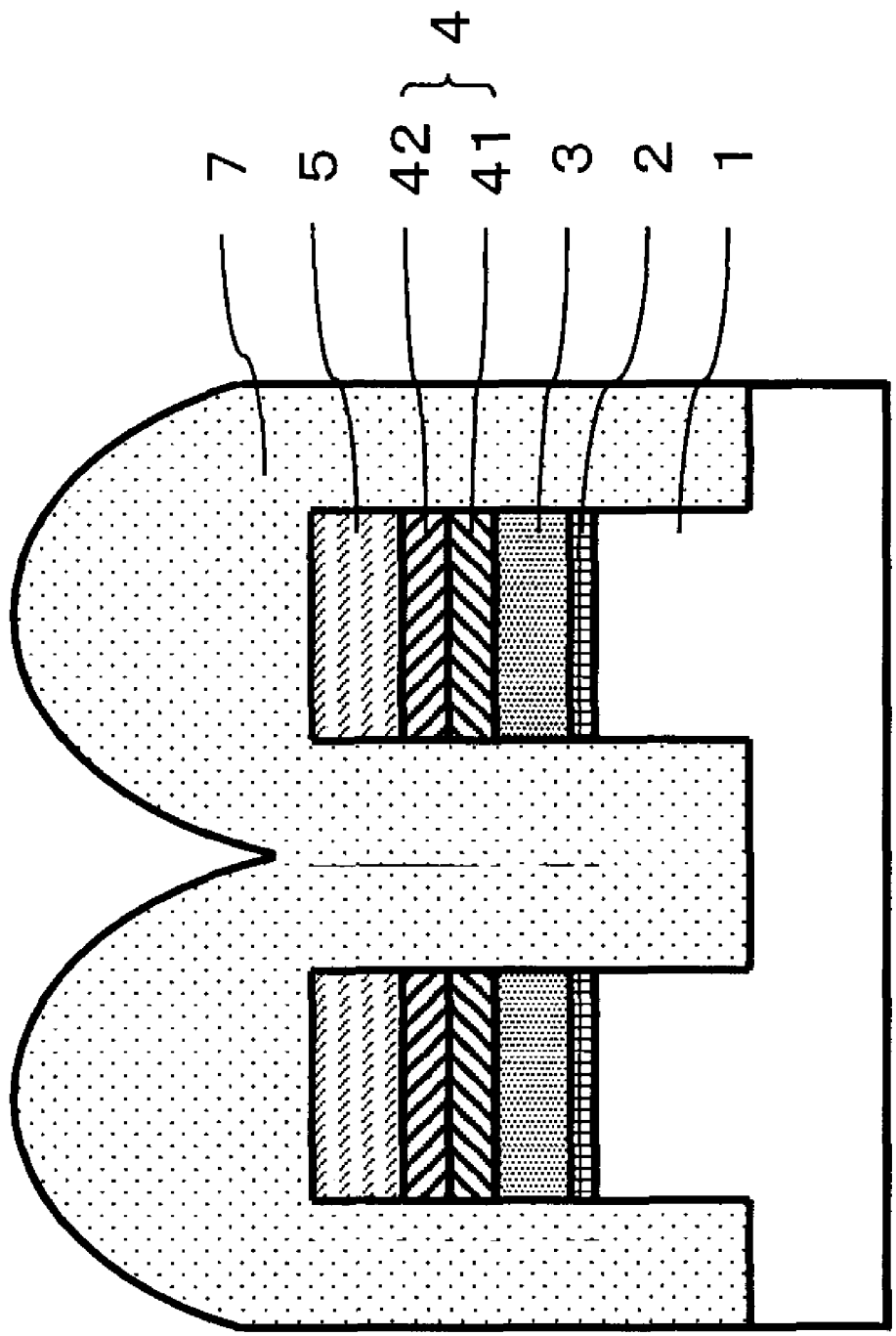
FIG. 3 is a schematic sectional diagram illustrating the method of manufacturing a semiconductor device according to the first embodiment of the invention.

Then, as FIG. 3 shows, a silicon oxide film which is to be an isolating insulating film 7 is formed to cover both the internal surfaces of the isolation trenches 6 and the silicon oxide films 5. The silicon oxide film mentioned above is formed using both TEOS and $O_3$ as material gases at a temperature of 450° C. In this way, the isolating insulating film 7 can be buried into the isolation trenches 6 without forming such gaps as voids and seams for reasons which will be described in detail later.

Figure 4:
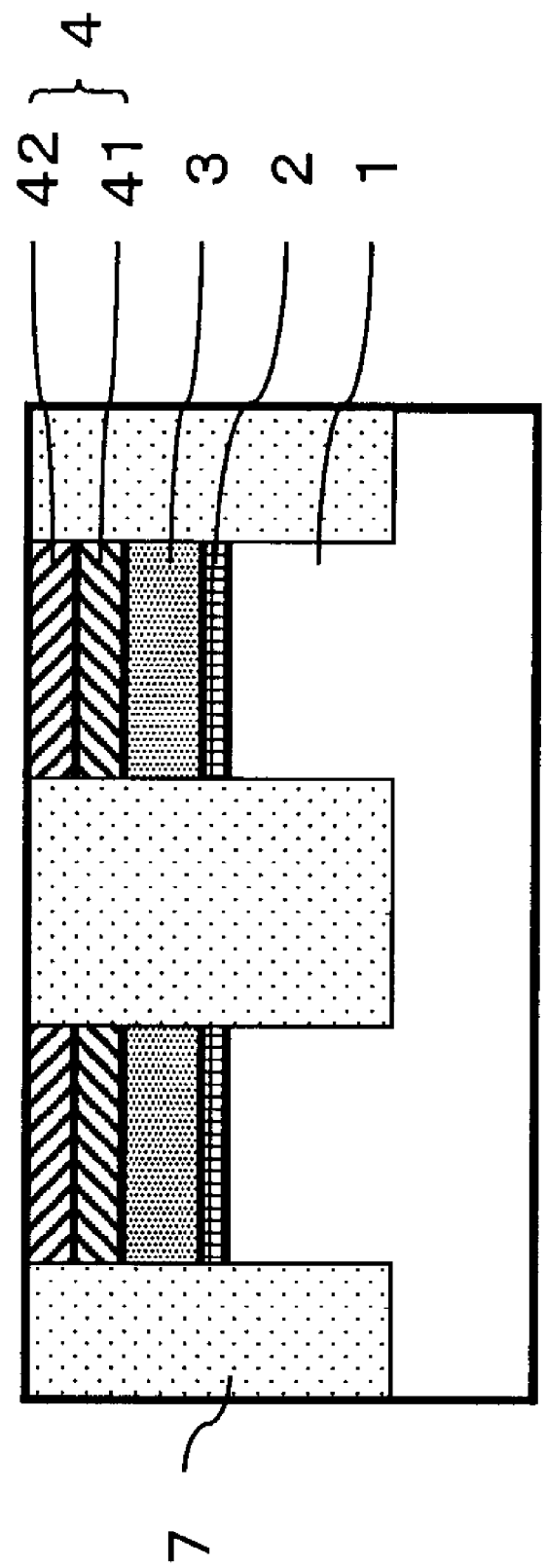
FIG. 4 is a schematic sectional diagram illustrating the method of manufacturing a semiconductor device according to the first embodiment of the invention.

Then, as FIG. 4 shows, the isolating insulating film 7 is flattened by a CMP method until reaching the level of the top surfaces of the high-density silicon nitride films 42. In this process, the silicon oxide films 5 are etched as well. As described above, the silicon nitride films 4 are used as the stopper in the CMP process. For this reason, the upper portion of each silicon nitride film 4 must be formed with a film that has a high film density.

Figure 5:
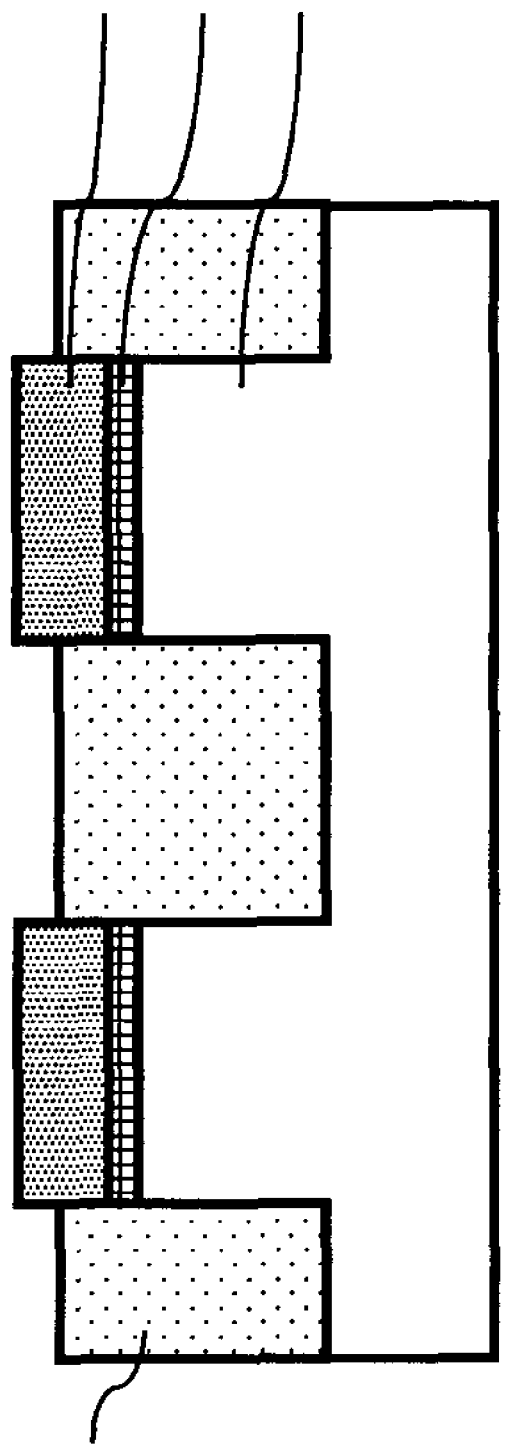
FIG. 5 is a schematic sectional diagram illustrating the method of manufacturing a semiconductor device according to the first embodiment of the invention.

Then, as FIG. 5 shows, the isolating insulating film 7 is etched by a RIE process and then by a process using a chemical solution such as hydrofluoric acid, so that the top surface of the isolating insulating film 7 is lowered down either to a level as high as the top surface of the floating gate electrodes 3 or to a level between the top and the bottom of the floating gate electrodes 3. Then, the silicon nitride films 4 are removed by a process using heated phosphoric acid.

Figure 6:
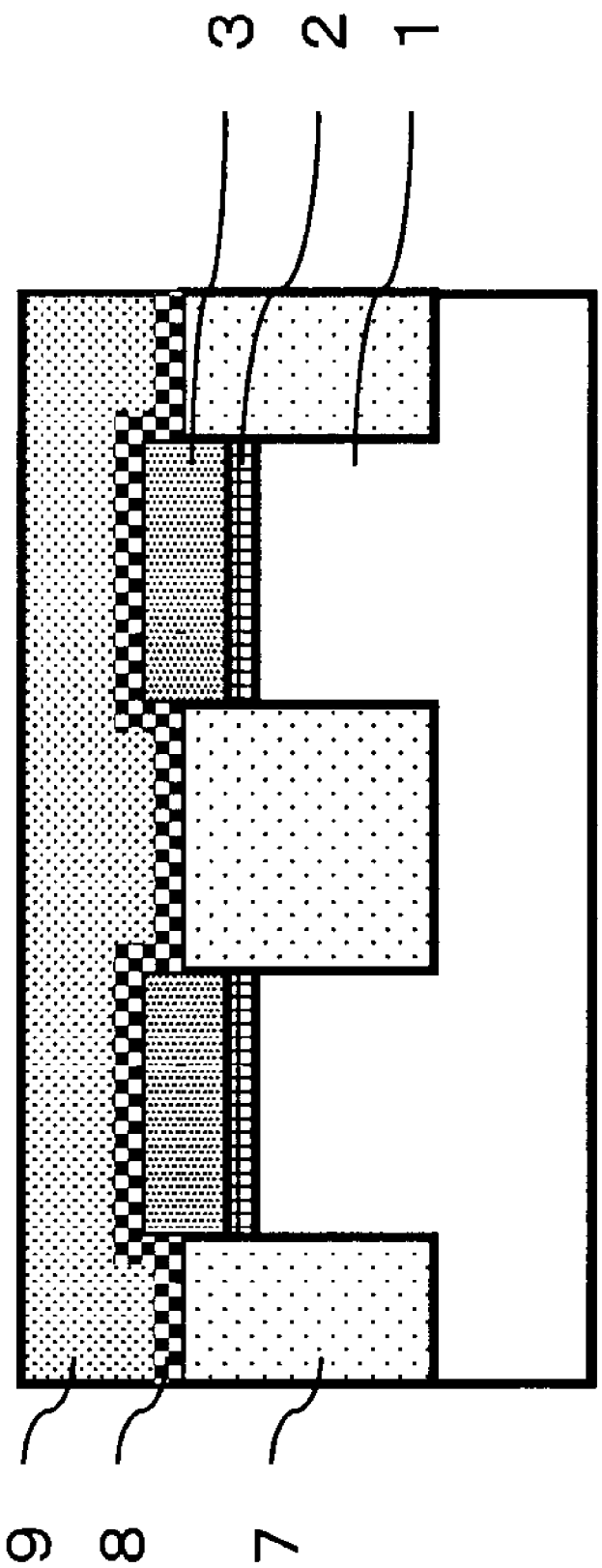
FIG. 6 is a schematic sectional diagram illustrating the method of manufacturing a semiconductor device according to the first embodiment of the invention.

Then, a P-doped polycrystalline silicon film that is to be an interelectrode insulating film 8 is formed to cover the floating gate electrodes 3 and the isolating insulating films 7, and then a layer of WSi that is to be a control gate electrode 9 is formed on the P-doped polycrystalline silicon film. After that, a flash memory shown in FIG. 6 is formed by a known technique.

Each silicon nitride film 4 of the first embodiment has a laminate structure including the low-density silicon nitride film 41 and the high-density silicon nitride film 42. Some of the effects to be obtained by the use of such a laminate structure will be described below.

Figure 7:
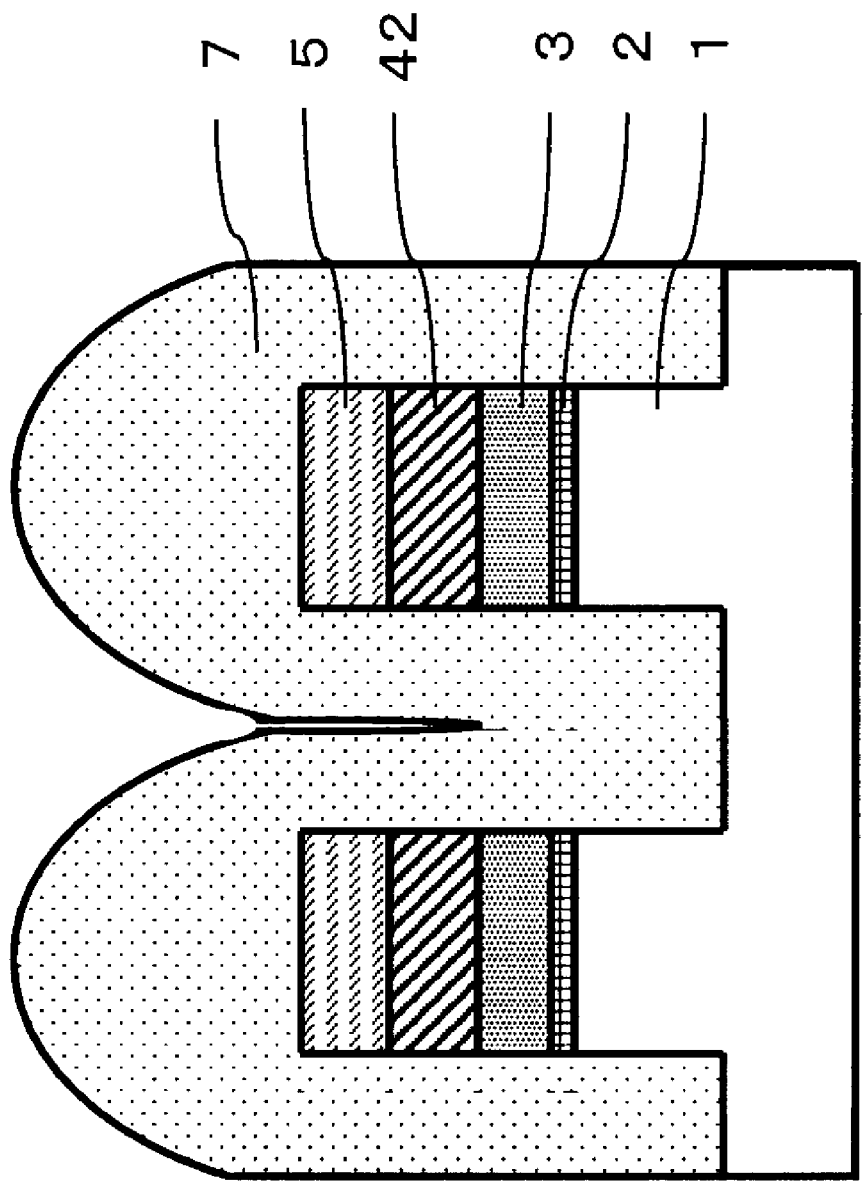
FIG. 7 is a schematic sectional diagram illustrating a method of manufacturing a semiconductor device according to a conventional technique.

As FIG. 7 shows, the conventional silicon nitride film does not include the low-density silicon nitride film 41, but only includes the high-density silicon nitride film 42. In this case, when the isolation trenches 6 are filled with the isolating insulating films 7, slight gaps are left in joint portions of the isolating insulating films 7.

This is because, when a low-temperature silicon oxide film that is made of a raw-material gas containing TEOS and $O_3$ is used as the isolating insulating films 7, the film-forming speed of the isolating insulating films 7 is more likely to be affected by the underlying materials as Table 1 shows. In Table 1, HCD-SiN means a silicon nitride film deposited in a mixed-gas atmosphere of HCD and $NH_3$, whereas DCS-SiN means a silicon nitride film deposited in a mixed-gas atmosphere of DCS and $NH_3$.

TABLE 1

| Underlying Material | Film-forming Temperature of Underlying Material [° C.] | Film-forming Speed of Isolating insulating film [nm/sec] |
|---|---|---|
| HCD-SiN | 465 | 1.45 |
|  | 550 | 1.34 |
|  | 650 | 1.23 |
| DCS-SiN | 700 | 1.22 |
|  | 780 | 1.22 |
| Si |  | 1.57 |

The film-forming speed of the isolating insulating films 7 on the semiconductor substrate 1 made of silicon is 1.57 nm/sec, whereas the film-forming speed of the isolating insulating films 7 on the high-density silicon nitride film 42 formed at a temperature of 780° C. in a mixed-gas atmosphere of DCS and $NH_3$ is 1.22 nm/sec. Accordingly, the film-forming speed of the isolating insulating films 7 on the semiconductor substrate 1 is slower than the film-forming speed of the isolating insulating films 7 on the high-density silicon nitride film 42.

As a result, isolating insulating films 7 that are formed on the sidewalls of the high-density silicon nitride films 42 are so thin that the joint portion of the isolating insulating films 7 cannot be closed completely. In this case, when the isolating insulating films 7 are etched with a chemical solution as shown in FIG. 5, the chemical solution permeates through the joint portion to etch the isolating insulating films 7, resulting in a problem that gaps are formed in the isolating insulating films 7.

In contrast, gaps are less likely to be formed in the isolating insulating films 7 in the case of the first embodiment where the silicon nitride film 4 has a laminate structure including the low-density silicon nitride film 41 and the high-density silicon nitride film 42 than in the case where the silicon nitride film 4 does not include the low-density silicon nitride film 41. This is because the film-forming speed of the isolating insulating film on the low-density silicon nitride film 41 is faster than the film-forming speed of the isolating insulating film on the high-density silicon nitride film 42, and approximates the film-forming speed of the isolating insulating film on the semiconductor substrate.

Although Table 1 has no film-forming speed of the isolating insulating film on the low-density silicon nitride film 41 deposited at a temperature of 420° C. in a mixed-gas atmosphere of HCD and $NH_3$, the film-forming speed of this case is known to be faster than the film-forming speed of the isolating insulating film on a silicon nitride film formed at a temperature of 465° C. in a mixed-gas atmosphere of HCD and $NH_3$. Accordingly, the film-forming speed on the low-density silicon nitride film 41 is 1.45 nm/sec or faster, and is faster than the film-forming speed on the high-density silicon nitride film 42. Hence, isolating insulating films 7 are formed in each isolation trench 6 thickly enough to bury the side surfaces of the low-density silicon nitride films 41. Consequently, no gaps are left in the isolating insulating films 7 in a portion burying the side surfaces of the low-density silicon nitride films 41.

In addition portions of the isolating insulating films 7 formed to bury the side surfaces of the low-density silicon nitride films 41 reach the level of the side surfaces of the high-density silicon nitride films 42. Accordingly, the isolating insulating films 7 are thicker in portions burying the side surfaces of the high-density silicon nitride films 42 than in the case with no low-density silicon nitride films 41. Consequently, no gaps are formed in the isolating insulating films 7.

Figure 8:
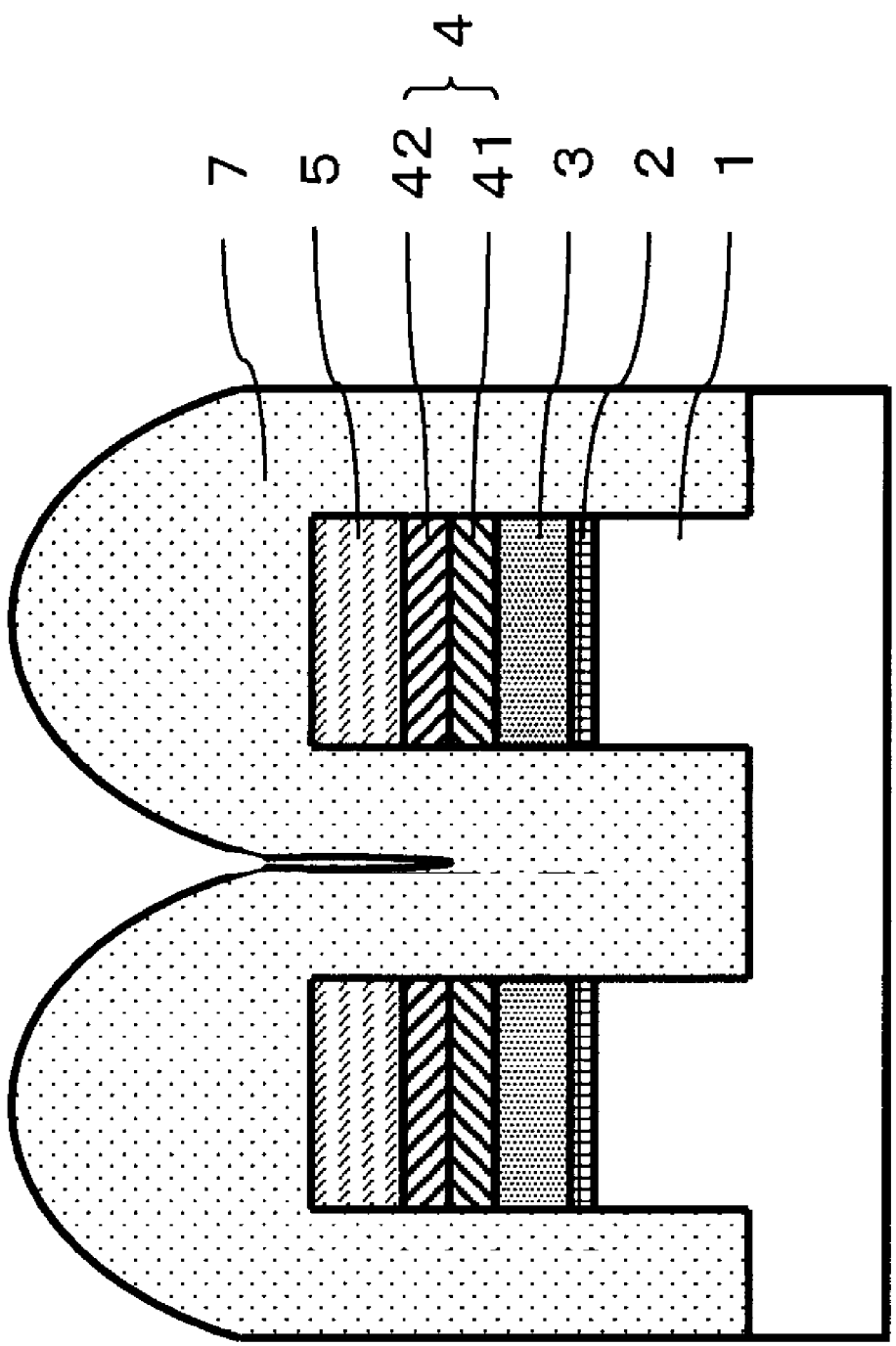
FIG. 8 is a schematic sectional diagram illustrating the method of manufacturing a semiconductor device according to the first embodiment of the invention.

Even if gaps are formed, the low-density silicon nitride films 41 existing under the corresponding high-density silicon nitride films 42 shift the gaps formed in the corresponding isolation trenches 6 upwards by an amount corresponding to the film thickness of each low-density silicon nitride film 41, and a structure shown in FIG. 8 is thus formed. To put it differently, even if gaps are formed in the isolating insulating films 7 in portions burying the side surfaces of the high-density silicon nitride films 42, no gap portions are formed in the isolating insulating film 7 in portions burying the side surfaces of the low-density silicon nitride films 41.

If the etching process using a chemical solution is preceded by a RIE process to remove the upper portions of the isolating insulating films 7 in which portions gaps are formed, no chemical solution permeates through the joint portions of the isolating insulating films 7.

In the first embodiment, the low-density silicon nitride films 41 are deposited at a temperature of 420° C. in a mixed-gas atmosphere of HCD and NH$_3$, and the high-density silicon nitride films 42 are deposited at a temperature of 780° C. in a mixed-gas atmosphere of DCS and NH$_3$. In this way, the first embodiment uses different kinds of gases in the atmospheres for the depositions, but an embodiment may use the same kind of gas for the depositions. For example, the low-density silicon nitride films 41 may be deposited in a mixed-gas atmosphere of HCD and NH$_3$ at a temperature of 400° C., and the high-density silicon nitride films 42 may be deposited in a mixed-gas atmosphere of HCD and NH$_3$ at a temperature of 650° C. To put it simply, the deposition processes of these two films may be done by varying only the film-forming temperature. What is necessary is to make the film-forming speed of the isolating insulating films 7 on the low-density silicon nitride films 41 fast enough to fill the isolating insulating films 7 completely in the isolation trenches 6 up to a level burying the side surfaces of the low-density silicon nitride films 41. Various alternative methods of forming silicon nitride films are conceivable. For example, the deposition may be performed in a mixed-gas atmosphere of BTBAS (Bis(Tertiary Butyl Amino)Silane) and NH$_3$, or in a mixed-gas atmosphere of TCS (Tetrachlorosilane) and NH$_3$. In addition, the deposition may be performed by the plasma CVD method, or by the atomic layer deposition (ALD) method.

In addition, since the high-density silicon nitride films 42 have only to serve as stoppers when the isolating insulating films 7 are ground in the CMP process shown in FIG. 4, the high-density silicon nitride films 42 may be made of other materials than those described above. In addition, the high-density silicon nitride films 42 may be replaced with low-density silicon nitride films, that is, the entire silicon nitride film 4 may be formed with the low-density silicon nitride film 41. In this case, to reduce the etched amount of the silicon nitride film 4, the conditions for the CMP process are adjusted as needed. This end is achieved by various methods, such as by reducing the load at the time of polishing, by decreasing the concentration of the abrasive grains used in the polishing, by increasing the concentration of the surfactant in the slurry, and by shortening the time of the over-polishing.

In addition, the raw materials of the silicon oxide film that is to be the isolating insulating films 7 are not limited to TEOS and O$_3$, and TEOS may be replaced, for example, with a cyclosiloxane, such as TMDSO (Tetramethyldisiloxane), HMDSO (Hexamethyldisiloxane), TMCTS (Tetramethylcyclotetrasiloxane), or with amorphous carbon.

In addition, in the first embodiment, the formation of the tunnel insulating films 2 and the floating gate electrodes 3 precedes the formation of the isolation trenches 6, but the formation of the isolation trenches 6 may precede the formation of the tunnel insulating films 2 and the floating gate electrodes 3.

(Second Embodiment)

A method of manufacturing a semiconductor device according to a second embodiment of the invention will be described by referring to FIGS. 9 to 14.

The second embodiment differs from the first embodiment in that each silicon nitride film 4 of the second embodiment has a structure in which low-density silicon nitride films 41 exist on the sidewalls of each high-density silicon nitride film 42.

Figure 9:
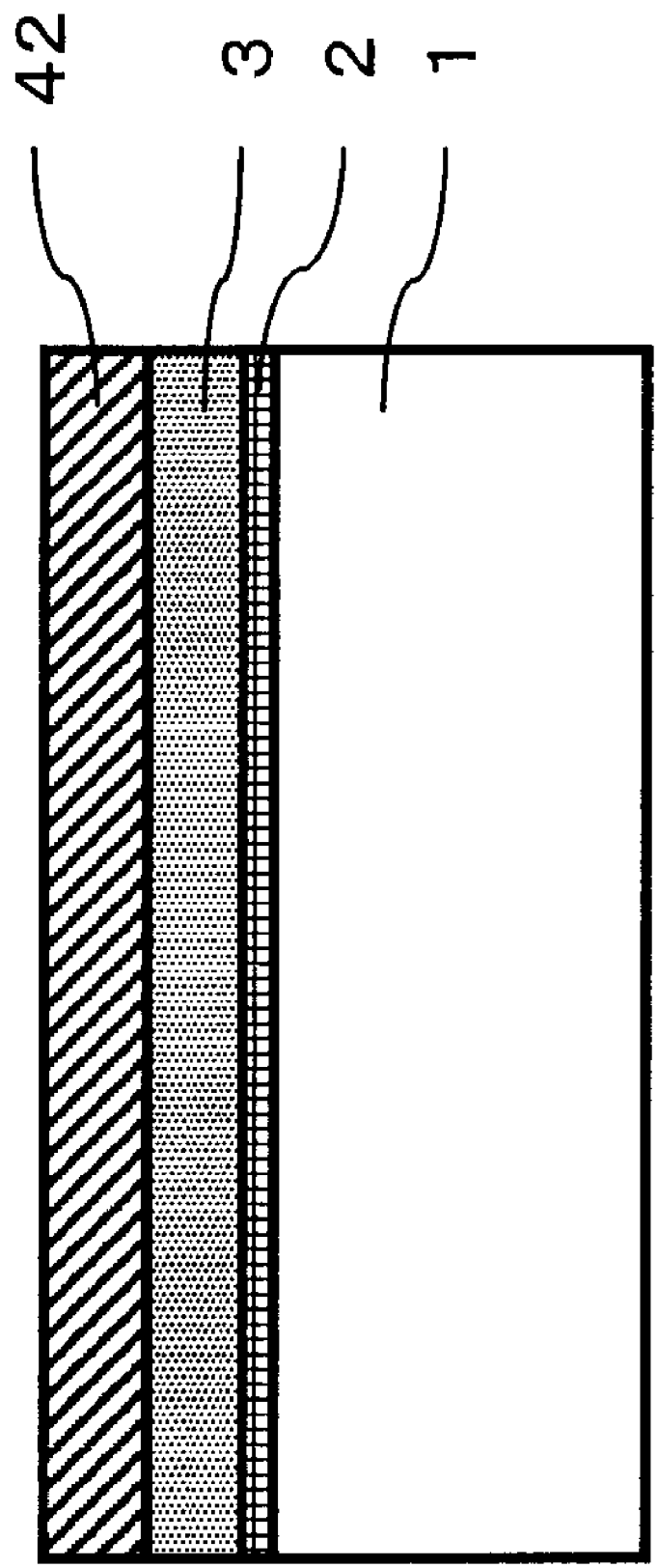
FIG. 9 is a schematic sectional diagram illustrating a method of manufacturing a semiconductor device according to a second embodiment of the invention.

As FIG. 9 shows, a SiON film which has a thickness of 8 nm and which is to be tunnel insulating films 2 is formed on a semiconductor substrate 1 doped with a desired impurity. Then, a P-doped polycrystalline silicon film which has a thickness of 80 nm and which is to be floating gate electrodes 3 is formed, and, after that, a high-density silicon nitride film 42 which has a thickness of 70 nm and which is to be parts of silicon nitride films 4 is formed. The high-density silicon nitride film 42 is deposited at a temperature of 780° C. in a mixed-gas atmosphere of DCS and NH$_3$.

Figure 10:
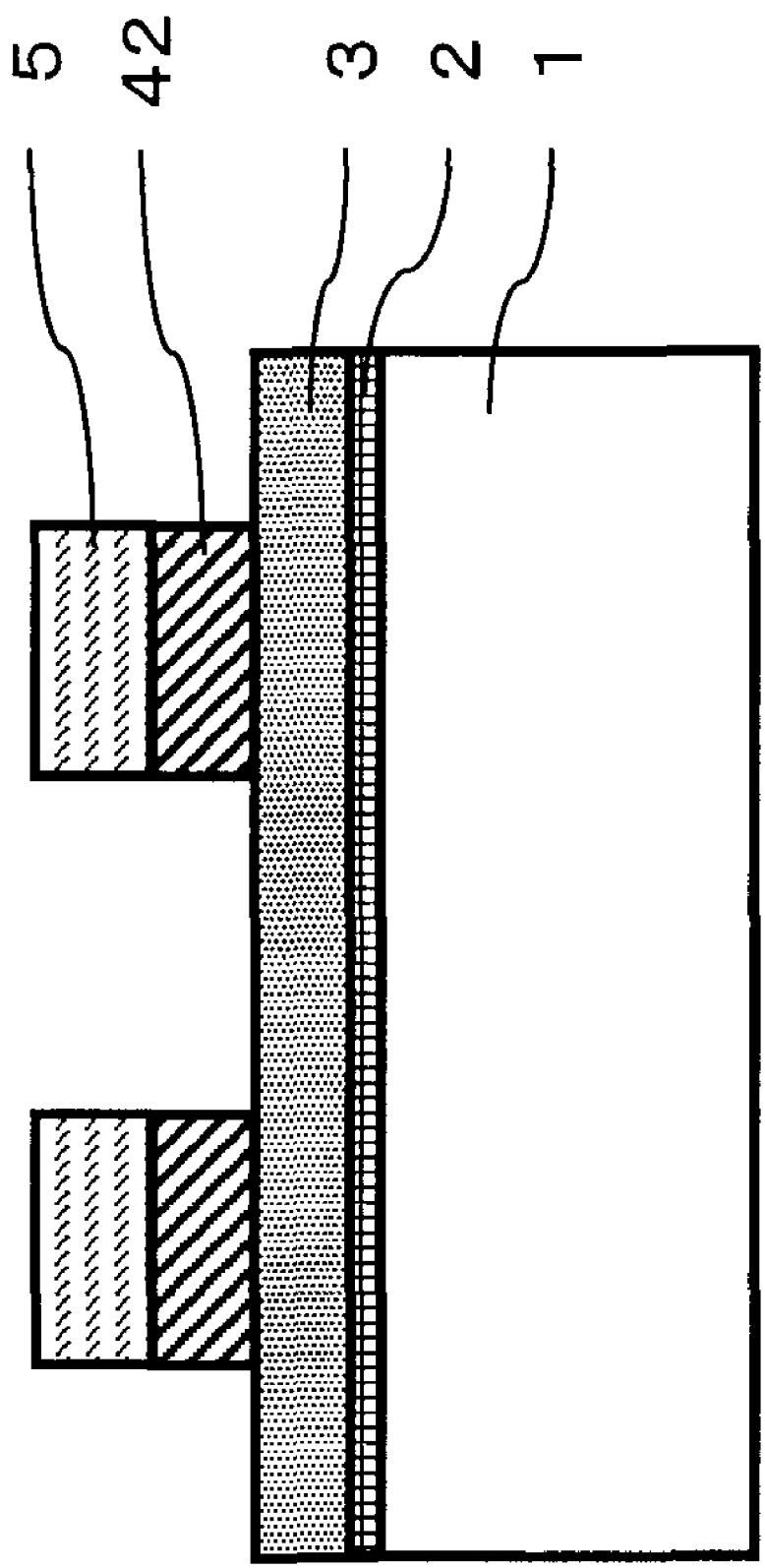
FIG. 10 is a schematic sectional diagram illustrating the method of manufacturing a semiconductor device according to the second embodiment of the invention.
Figure 11:
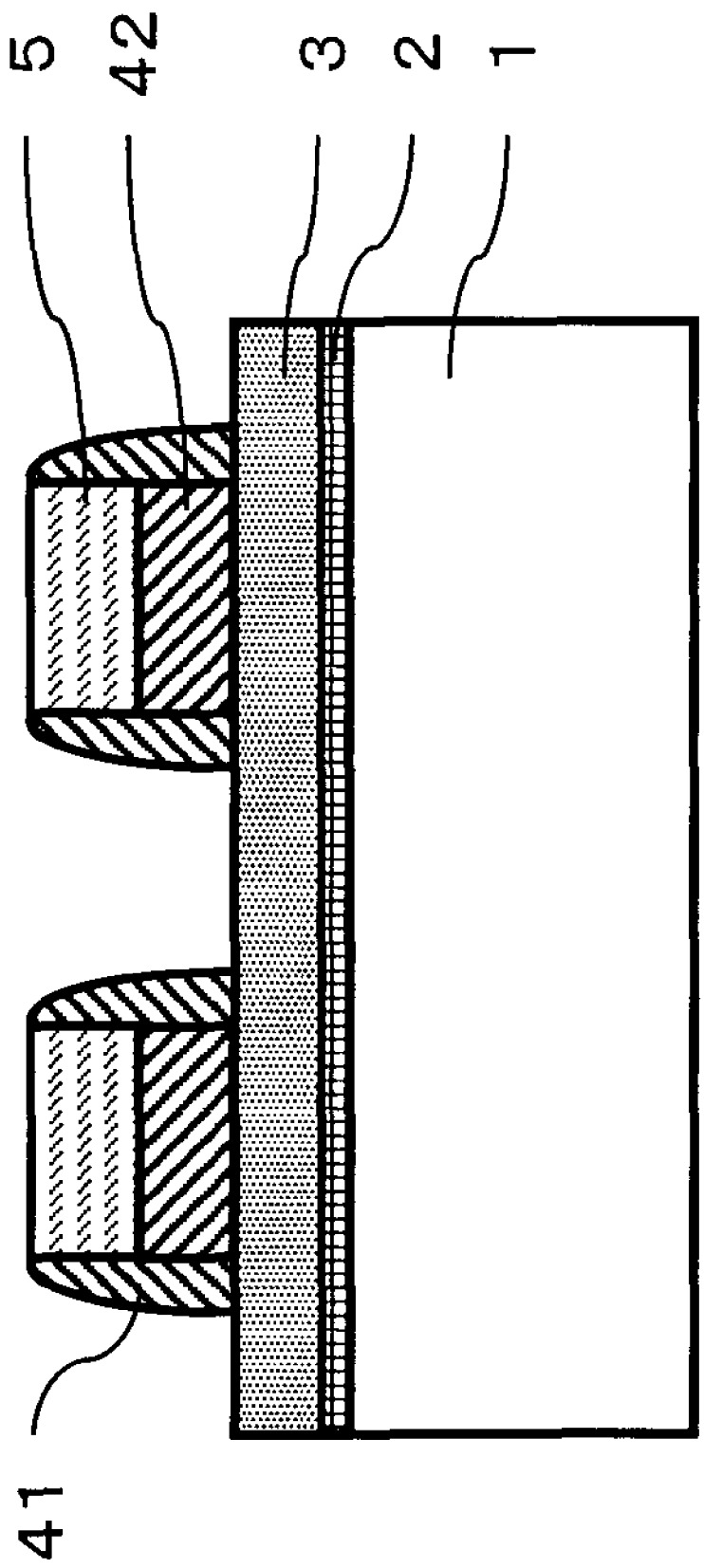
FIG. 11 is a schematic sectional diagram illustrating the method of manufacturing a semiconductor device according to the second embodiment of the invention.

Then, a silicon oxide film 5 is formed on the high-density silicon nitride film 42. After that, with a resist film (not illustrated) used as a mask, the silicon oxide film 5 and the high-density silicon nitride film 42 are processed by a RIE process as FIG. 10 shows.

Then, a low-density silicon nitride film 41 which has a thickness of 5 nm is deposited at a temperature of 420° C. in a mixed-gas atmosphere of HCD and NH$_3$. Before the low-density silicon nitride film 41 is formed, the sidewalls of the high-density silicon nitride films 42 may be etched with heated phosphoric acid. Then, the low-density silicon nitride film 41 is etched by a RIE process until the top surfaces of the silicon oxide films 5 are exposed. In this way, each silicon nitride film 4 has a structure shown in FIG. 11, that is, a structure in which the low-density silicon nitride films 41 exist respectively on the two side surfaces of each high-density silicon nitride film 42.

Figure 12:
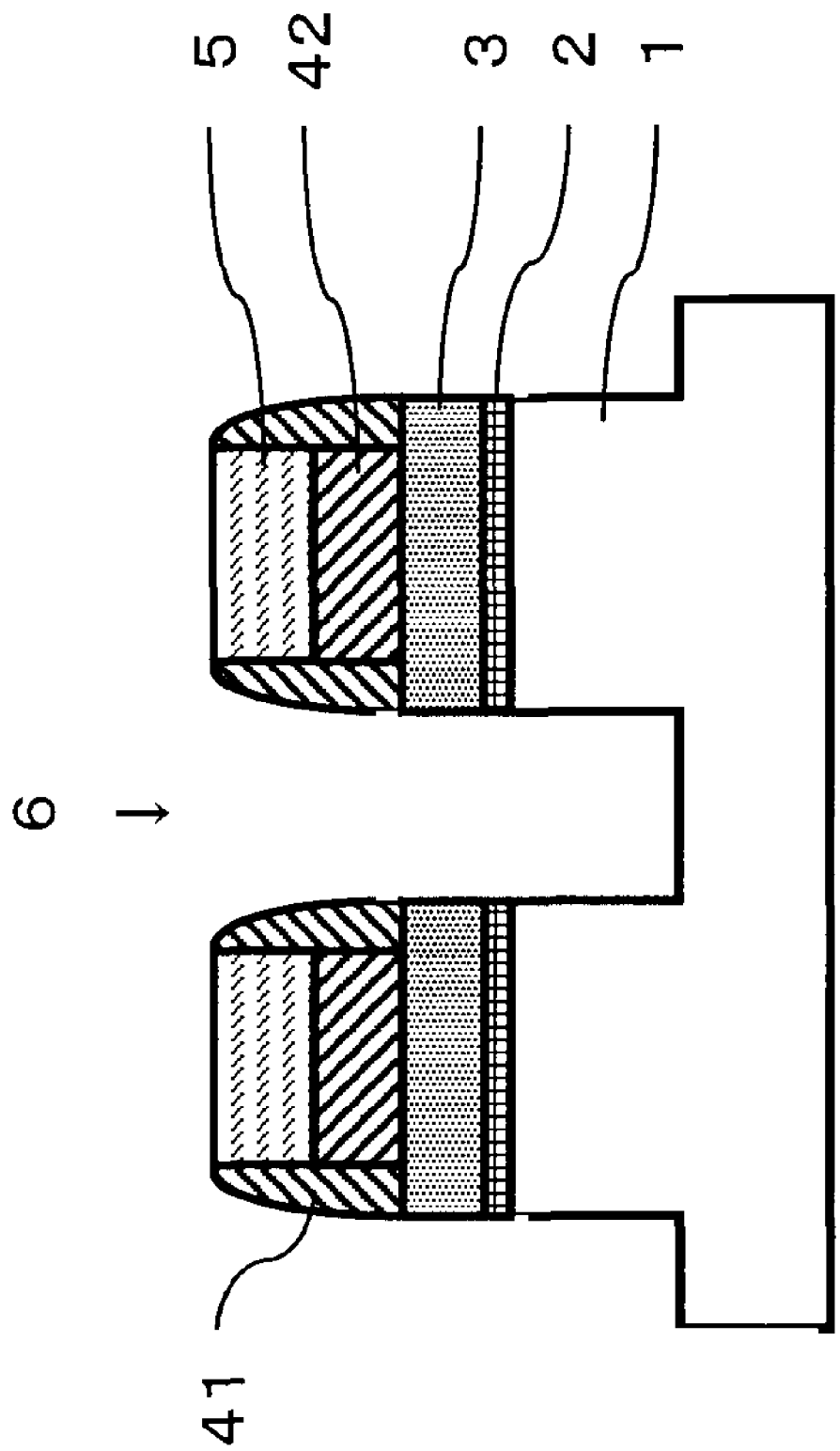
FIG. 12 is a schematic sectional diagram illustrating the method of manufacturing a semiconductor device according to the second embodiment of the invention.

Then, with the low-density silicon nitride films 41, the high-density silicon nitride films 42, and the silicon oxide films 5 used as a mask, the film which is to be the floating gate electrodes 3, the film which is to be the tunnel insulating films 2, and the semiconductor substrate 1 are processed sequentially. In this way, isolation trenches 6 are formed as FIG. 12 shows. The low-density silicon nitride films 41 are exposed in the sidewalls of the isolation trenches 6.

Figure 13:
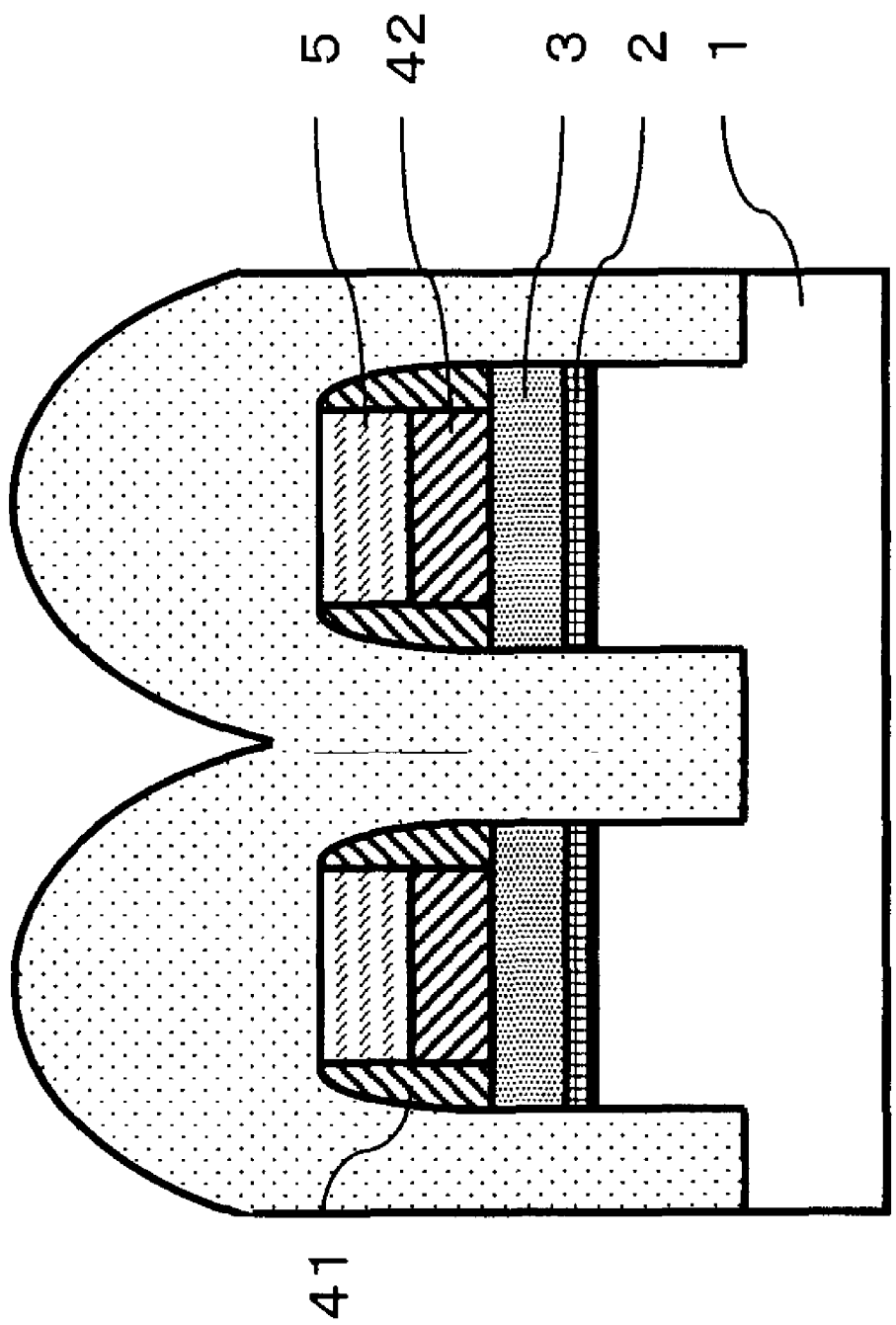
FIG. 13 is a schematic sectional diagram illustrating the method of manufacturing a semiconductor device according to the second embodiment of the invention.

Then, as FIG. 13 shows, a silicon oxide film which is to be an isolating insulating film 7 is formed to cover both the internal surfaces of the isolation trenches 6 and the silicon oxide films 5.

Figure 14:
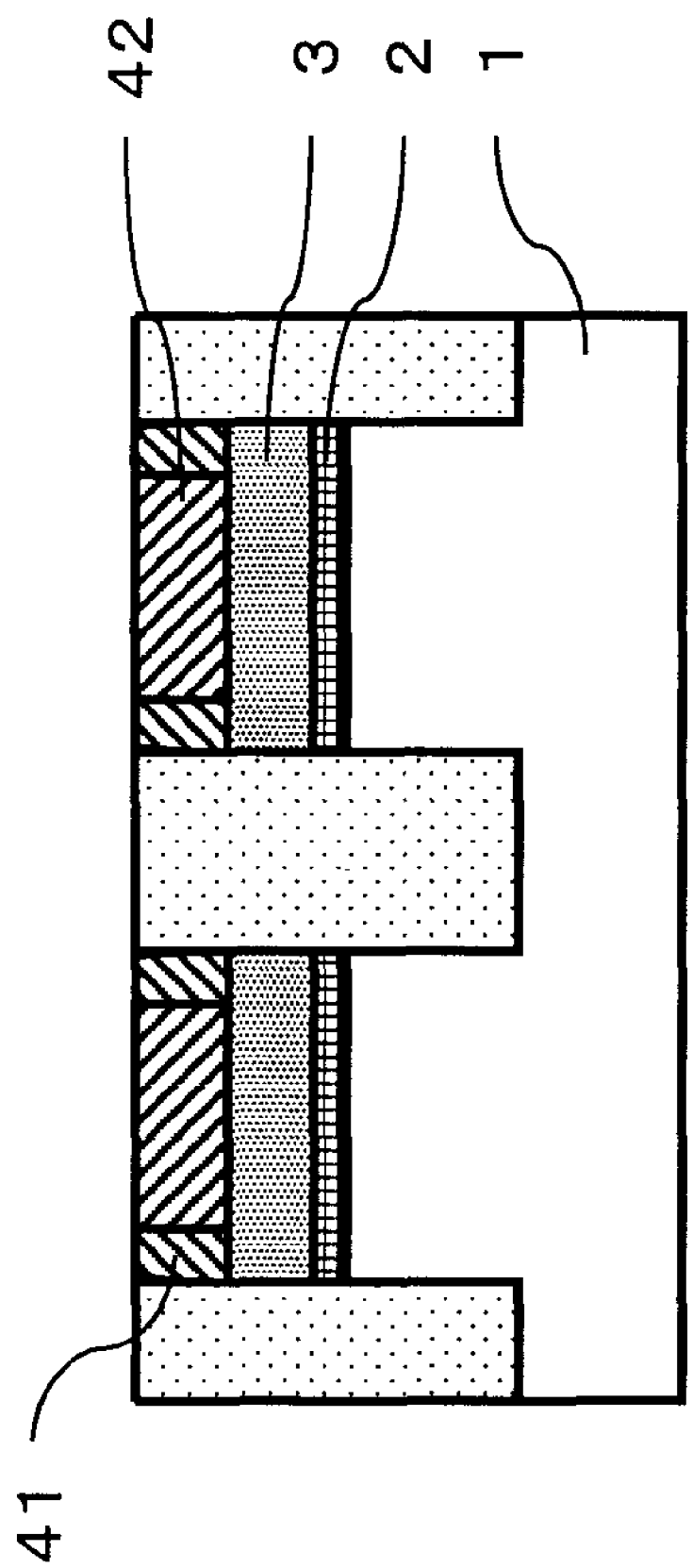
FIG. 14 is a schematic sectional diagram illustrating the method of manufacturing a semiconductor device according to the second embodiment of the invention.

Then, as FIG. 14 shows, the isolating insulating film 7 is flattened by a CMP method until reaching the level of the top surfaces of the high-density silicon nitride films 42. In this process, the silicon oxide films 5 and parts of the low-density silicon nitride films 41 are etched as well.

After that a flash memory shown in FIG. 6 is formed by a method that is similar to the one employed in the first embodiment.

In the second embodiment, as FIG. 13 shows, the isolating insulating films 7 are not in contact with the high-density silicon nitride films 42 but in contact only with the low-density silicon nitride films 41. Accordingly, the isolating insulating film 7 is formed in each isolation trench 6 thickly enough to bury the side surfaces of the low-density silicon nitride films 41. Accordingly no gap is left in the joint portion of the isolating insulating films 7, so that neither voids nor seams are formed.

In addition, in the silicon nitride films 4 of the second embodiment, all the portions that are in contact with the isolating insulating films 7 are the low-density silicon nitride films 41, so that isolating insulating films 7 in the second embodiment are formed thicker in portions burying the side surfaces of the silicon nitride films 4 than in the case of the first embodiment. Accordingly, gaps are even less likely to be formed in the second embodiment at the joint portions of the isolating insulating films than in the case of the first embodiment.

The film-forming conditions for forming the low-density silicon nitride film 41 and the high-density silicon nitride film 42 are not limited to the ones mentioned in the method described above. What is necessary is to secure sufficiently fast film-forming speed of the isolating insulating films 7 on the low-density silicon nitride films 41 and to make the high-density silicon nitride films 42 usable as stoppers in the CMP process. Accordingly, the entire silicon nitride films 4 may be formed with the low-density silicon nitride films 41 without the high-density silicon nitride films 42.

In addition, as in the case of the first embodiment, the raw materials of the silicon oxide film which is to be the isolating insulating films 7 are not limited to TEOS and $O_3$.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

The invention claimed is:

1. A method of manufacturing a semiconductor device, comprising the steps of:
    forming a tunnel insulating film on a semiconductor substrate;
    forming a floating gate electrode on the tunnel insulating film;
    forming a silicon nitride film including a low-density silicon nitride film and a high-density silicon nitride film on the floating gate electrode;
    forming an isolation trench by processing the silicon nitride film, the floating gate electrode, the tunnel insulating film, and the semiconductor substrate, and thereby exposing the low-density silicon nitride film at least in a portion of a side surface of the isolation trench;
    forming an isolating insulating film which covers an internal surface of the isolation trench;
    flattening the isolating insulating film;
    etching the isolating insulating film and thereby lowering a top surface of the isolating insulating film;
    removing the silicon nitride film; and
    forming an interelectrode insulating film and a control gate electrode which cover the floating gate electrode and the isolating insulating film.

2. The method of manufacturing a semiconductor device according to claim 1, wherein a kind of gas in a film-forming atmosphere for the low-density silicon nitride film differ from a kind of gas in a film-forming atmosphere for the high-density silicon nitride film.

3. The method of manufacturing a semiconductor device according to claim 2, wherein the low-density silicon nitride film is formed in an atmosphere of a gas containing HCD, and the high-density silicon nitride film is formed in an atmosphere of a gas containing DCS.

4. The method of manufacturing a semiconductor device according to claim 1, wherein a film-forming temperature of the low-density silicon nitride film differs from a film-forming temperature of the high-density silicon nitride film.

5. The method of manufacturing a semiconductor device according to claim 4, wherein the film-forming temperature of the low-density silicon nitride film is lower than the film-forming temperature of the high-density silicon nitride film.

6. The method of manufacturing a semiconductor device according to claim 1, wherein the high-density silicon nitride film exists on the low-density silicon nitride film.

7. The method of manufacturing a semiconductor device according to claim 6, wherein, in the step of forming the isolating insulating film in the isolation trench, no gap is formed in the isolating insulating film in a portion burying a side surface of the low-density silicon nitride film.

8. The method of manufacturing a semiconductor device according to claim 1, wherein the low-density silicon nitride film exists on a sidewall of the high-density silicon nitride film.

9. The method of manufacturing a semiconductor device according to claim 8, wherein the isolating insulating film is not in contact with a side surface of the high-density silicon nitride film in the step of forming the isolating insulating film.

10. The method of manufacturing a semiconductor device according to claim 1, wherein the step of flattening is a CMP step.

11. The method of manufacturing a semiconductor device according to claim 10, wherein the high-density silicon nitride film is used as an etching stopper in the CMP step.

12. The method of manufacturing a semiconductor device according to claim 1, wherein a film-forming speed of the isolating insulating film on the high-density silicon nitride film differs from a film-forming speed of the isolating insulating film on the low-density silicon nitride film.

13. The method of manufacturing a semiconductor device according to claim 12, wherein the film-forming speed of the isolating insulating film on the high-density silicon nitride film is slower than the film-forming speed of the isolating insulating film on the low-density silicon nitride film.

14. The method of manufacturing a semiconductor device according to claim 1, wherein the isolating insulating film is formed using $O_3$ and any one of TEOS, TMDSO, HMDSO, and TMCTS.

* * * * *